(12) United States Patent
R et al.

(10) Patent No.: US 11,144,207 B2
(45) Date of Patent: Oct. 12, 2021

(54) ACCELERATING MEMORY COMPRESSION OF A PHYSICALLY SCATTERED BUFFER

(71) Applicant: International Business Machines Corporation, Armonk, NY (US)

(72) Inventors: Vishnupriya R, Kerala (IN); Manish Mukul, Bengaluru (IN); Mehulkumar Patel, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 16/676,851

(22) Filed: Nov. 7, 2019

(65) Prior Publication Data

US 2021/0141535 A1 May 13, 2021

(51) Int. Cl.
*H03M 7/30* (2006.01)
*G06F 12/02* (2006.01)
(Continued)

(52) U.S. Cl.
CPC .......... *G06F 3/0608* (2013.01); *G06F 3/0656* (2013.01); *G06F 3/0673* (2013.01); *G06F 9/30047* (2013.01); *G06F 12/023* (2013.01); *G06F 12/08* (2013.01); *H03M 7/6023* (2013.01); *H03M 7/6058* (2013.01); *G06F 2212/401* (2013.01)

(58) Field of Classification Search
None
See application file for complete search history.

(56) References Cited

U.S. PATENT DOCUMENTS

| 5,729,228 A * | 3/1998 | Franaszek | G06T 9/005 |
| | | | 341/106 |
| 7,051,126 B1 * | 5/2006 | Franklin | G06F 13/122 |
| | | | 709/247 |

(Continued)

FOREIGN PATENT DOCUMENTS

| CN | 102970043 B | 3/2016 |
| CN | 109491599 A | 3/2019 |

OTHER PUBLICATIONS

Cheng et al. "Effective INTER-Parallel Schemes for Compression/Decompression Speed-Up." Apr. 1997. IBM. IBM Technical Disclosure Bulletin. vol. 40. pp. 157-166.*

(Continued)

*Primary Examiner* — Nathan Sadler
(74) *Attorney, Agent, or Firm* — Patterson & Sheridan, LLP

(57) ABSTRACT

Embodiments herein describe using compression engines in a processor subsystem to compress only the data fragments stored locally. That is, an application may be allocated a buffer where the physical memory of that buffer is spread across multiple processor subsystems. Rather than asking a single actor (e.g., a single host processor or compression engine) to compress all the fragments of the buffer, a compression library can instead instruct the individual compression engines in each of the processor subsystems to compress only the fragments stored in local memory in the same processor subsystem. Doing so leverages the memory affinity between the compression engines in the local memory which can reduce the overall time required to perform compression.

20 Claims, 5 Drawing Sheets

(51) Int. Cl.
    *G06F 12/08*     (2016.01)
    *G06F 3/06*     (2006.01)
    *G06F 9/30*     (2018.01)

(56) References Cited

U.S. PATENT DOCUMENTS

| | | | |
|---|---|---|---|
| 9,477,682 B1* | 10/2016 | Bent | G06F 16/2365 |
| 9,836,473 B2 | 12/2017 | Dickie et al. | |
| 2018/0234110 A1* | 8/2018 | Kaldewey | H03M 7/6058 |
| 2019/0034333 A1* | 1/2019 | Sazegari | G06F 12/0886 |
| 2020/0110670 A1* | 4/2020 | Artico | H03M 7/6052 |
| 2021/0152183 A1* | 5/2021 | Lu | H03M 7/30 |

OTHER PUBLICATIONS

Klein et al. "Parallel Lempel Ziv coding." Dec. 2005. Elsevier. Discrete Applied Mathematics. vol. 146. pp. 180-191.*
Gilchrist et al. "Parallel Lossless Data Compression Based on the Burrows-Wheeler Transform." May 2007. IEEE. AINA'07.*
Intel. "Programming Intel® QuickAssist Technology Hardware Accelerators for Optimal Performance." Apr. 2015. https://01.org/sites/default/files/page/332125_002_0.pdf.*
Gailly et al. "zlib 1.2.11 Manual." Jan. 2017. https://zlib.net/manual.html.*
Qiao et al., "High-Throughput Lossless Compression on Tightly Coupled CPU-FPGA Platforms," IEEE 26th Annual International Symposium on Field-Programmable Custom Computing Machines (FCCM), 2018, 8 pages.

* cited by examiner

ACCELERATING MEMORY COMPRESSION OF A PHYSICALLY SCATTERED BUFFER

BACKGROUND

The present invention relates to compressing a buffer that contains memory fragments scattered between different processor subsystems.

Gzip is a popular industry standard memory compression algorithm. An application allocating a large memory buffer in user address space on a multi socket/multi node system does not know the layout of its physical pages. That is, the physical pages of the buffer may be spread across multiple processor subsystems such as CPU sockets, processor complexes, and Central Electronic Complex (CEC) nodes on a large symmetric multiprocessing (SMP) computing system. If memory compression is entirely done by host processors, most modern day operating systems optimize memory accesses by scheduling application on a socket where its memory resides. However, when such compression job is performed by an accelerator or a special input/output (IO) engine, there is minimal intelligence for optimizing memory affinity.

SUMMARY

One embodiment of the present invention is a method that includes receiving a request to compress a buffer comprising a plurality of fragments, identifying a plurality of processor subsystems in a computing system that each stores at least one of the plurality of fragments in a local memory where each of the plurality of processor subsystems comprises a compression engine, instructing each compression engine in the plurality of processor subsystems to compress only fragments of the plurality of fragments stored in the same processor subsystem as the respective compression engine, and storing the compressed fragments in an output buffer.

Another embodiment of the present invention is a system that includes a plurality of processor subsystems, each comprising a local memory and a compression engine, and a compression library. The compression library is configured to receive a request to compress a buffer comprising a plurality of fragments, identify a subset of the plurality of processor subsystems each stores at least one of the plurality of fragments, and instruct each compression engine in the plurality of processor subsystems to compress only fragments of the plurality of fragments stored in the same processor subsystem as the compression engine and store the compressed fragments in an output buffer.

Another embodiment of the present invention is a computer readable storage medium having computer readable program code embodied therewith, the computer readable program code executable by one or more computer processors to perform an operation. The operation includes receiving a request to compress a buffer comprising a plurality of fragments, identifying a plurality of processor subsystems in a computing system that each stores at least one of the plurality of fragments in a local memory where each of the plurality of processor subsystems comprises a compression engine, instructing each compression engine in the plurality of processor subsystems to compress only fragments of the plurality of fragments stored in the same processor subsystem as the compression engine, and storing the compressed fragments in an output buffer.

DETAILED DESCRIPTION

Embodiments herein describe using compression engines in a processor subsystem to compress only the data fragments stored locally. That is, an application may allocate a large buffer where the physical memory of that buffer is spread across multiple processor subsystems. Rather than asking a single actor (e.g., a single host processor or compression engine) to compress all the fragments of the buffer, a compression library can instead instruct the individual compression engines in each of the processor subsystems to compress only the fragments stored in local memory in the same processor subsystem. Doing so leverages the memory affinity between the compression engines and the local memory which can reduce the overall time required to perform compression. That is, using local compression engines to compress the fragments stored in local memory avoids memory requests between the processor subsystems that add substantial latency to the compression process.

In one embodiment, the compression library instructs the compression engines to compress their corresponding fragments sequentially. After each compression engine completes, the compression library can receive history (e.g., backward references) from the engine and forward this history to the next compression engine. Sharing the history may improve the compression efficiency.

In another embodiment, the compression library instructs the compression engines to compress their corresponding fragments in parallel. In this scenario, the fragments of the buffer are compressed simultaneously. However, while this can reduce the time required for compression since the compression engines operate in parallel, the compression engines do not share their history information which may make compression less efficient relative to compressing data using history information. Thus, compressing the data sequentially or in parallel represents a tradeoff between permitting the compression engines to operate in parallel and the advantages of sharing the backward references between the engines.

Figure 1:
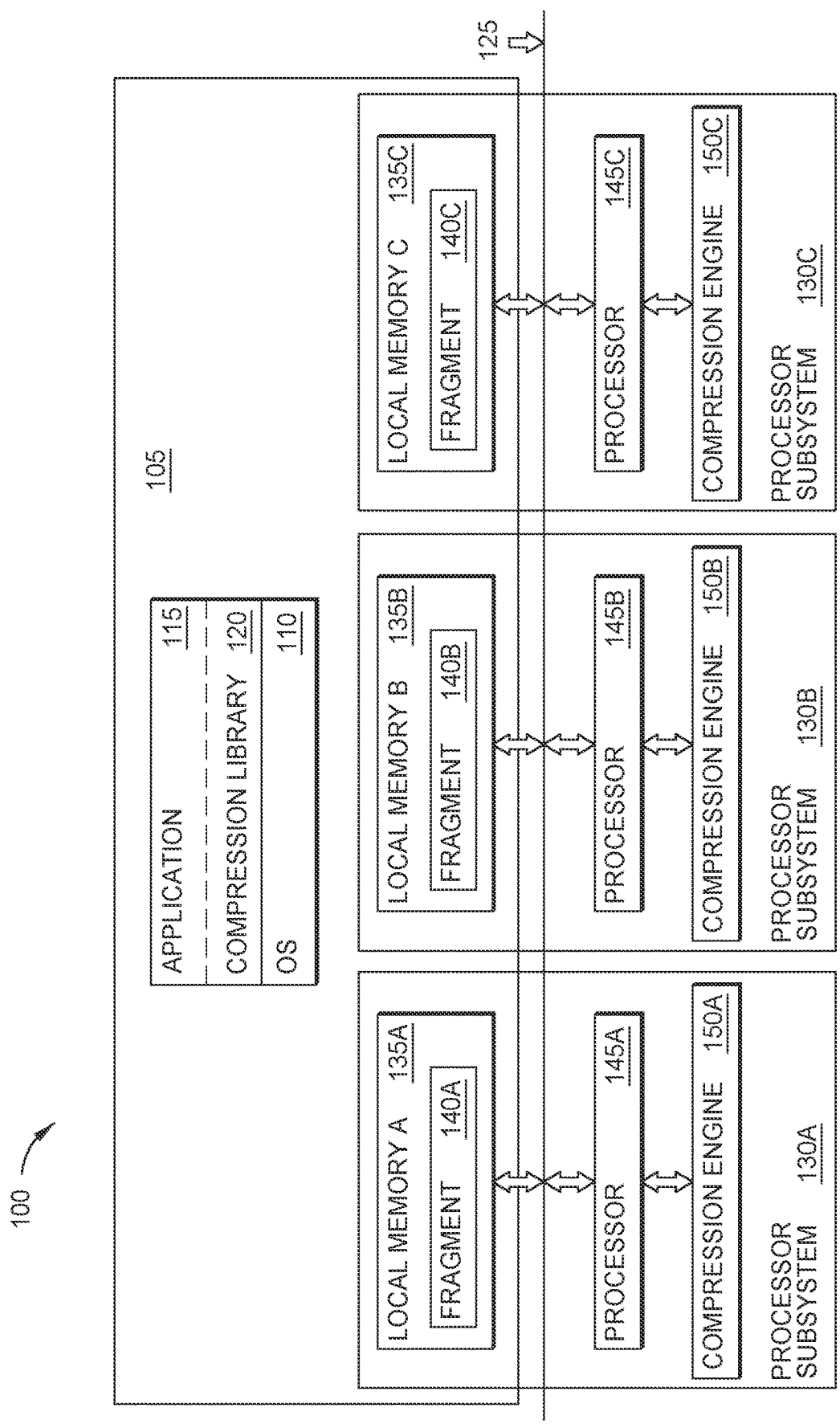
FIG. 1 illustrates a computing system with multiple processor subsystems, according to one embodiment described herein.

FIG. 1 illustrates a computing system 100 with multiple processor subsystems 130, according to one embodiment described herein. In one embodiment, the computing system is a multi-socket SMP system that includes multiple identical processors 145 that that have respective local host memory 135. The processors 145 may have full access to input and output (I/O) devices connected to the system 100

(regardless of where those I/O devices are connected to the system 100). The SMP system also includes an operating system (OS) 110 which may treat all the processors 145 equally.

As shown, the main memory 105 includes local memories 135 for each of the processor subsystems 130. The main memory 105 also includes the OS 110, a software application 115, and a compression library 120. The application 115 is any software application that allocates a large buffer in user address space (referred to herein as virtual address space). That is, the OS 110 (or a hypervisor) may provide a user address space that includes a range of virtual addresses. These virtual addresses correspond to physical memory address that are represented by fragments 140 (e.g., a physical page of memory) stored in local memories 135 in the processor subsystems 130. That is, the buffer allocated to the application 115 has a virtual address range that corresponds to a plurality of fragments 140 that are physically distributed throughout the processor subsystems 130.

The compression library 120 is a software library containing various methods and application programming interfaces (APIs) for compressing the buffer allocated to the application 115. As described in more detail below, the application 115 sends a request to the compression library 120 to compress its buffer, and in response, the compression library 120 identifies the various fragments 140 of the buffer and their physical locations in the local memories 135 (e.g., the physical memory addresses of the fragments 140). The compression library 120 can then instruct the hardware resources (e.g., an accelerator engine) in the processor subsystem 130 to compress the fragments 140 (or fragments 140) stored in the local memories 135. For example, the compression library 120 instructs a compression engine 150A in processor subsystem 130A to compress the fragment 140A, but not the fragments 140B and 140C stored in the different processor subsystems 130B and 130C. Similarly, the compression library 120 instructs the compression engine 150B to compress the fragment 140B, but not the fragments 140A and 140C, and so forth. In this manner, during compression, each compression engine 150 accesses only the local memory 135 in the same processor subsystem 130, which may be a lower latency memory request than accessing data stored in local memory 135 in a different processor subsystem 130 than the compression engine 150. Thus, by distributing the task of compressing the buffer of the application 115 among the different processor subsystems 130, the compression library 120 can avoid the longer latency associated with performing memory requests between the processor subsystems 130.

In FIG. 1, each of the processor subsystems 130 include the local memory 135, the processor 145, and the compression engine 150. In one embodiment, the local memory 135 is a cache (or multiple levels of cache—L1/L2). The local memory 135 can include DRAM or other volatile or non-volatile memory elements. While FIG. 1 illustrates that each local memory 135 stores a fragment 140 of the buffer allocated to the application 115, each of the local memories 135 can store multiple fragments 140 (e.g., multiple physical pages of memory) assigned to the buffer. Further, in other examples, some of the local memories 135 may not store any fragments 140 of the buffer, while other memories 135 can store multiple fragments.

The processor 145 can represent multiple processing elements (e.g., multiple central processing units (CPUs)) that each can include any number of cores. In one embodiment, the processor 145 can be referred to as a socket where each processor subsystem 130 includes a CPU socket.

The compression engine 150 include circuitry that performs data compression. In one embodiment, the compression engine 150 is a hardware accelerator that is communicatively coupled to the processor 145 through the system bus 125. For example, the compression engine may be a PCIe or I/O adapter. In one embodiment, the compression engine 150 is implemented using a field programmable gate array (FPGA). While the embodiments herein describe using the compression engine 150, which is shown being separate from the processor 145, in another embodiment, the compression engine 150 may be specialized hardware in the processor 145 (other than processor core). That is, the embodiments below describe using hardware resources in a processor subsystem 130 to perform compression on data stored in the local memory 135 of that same processor subsystem 130.

Figure 2:
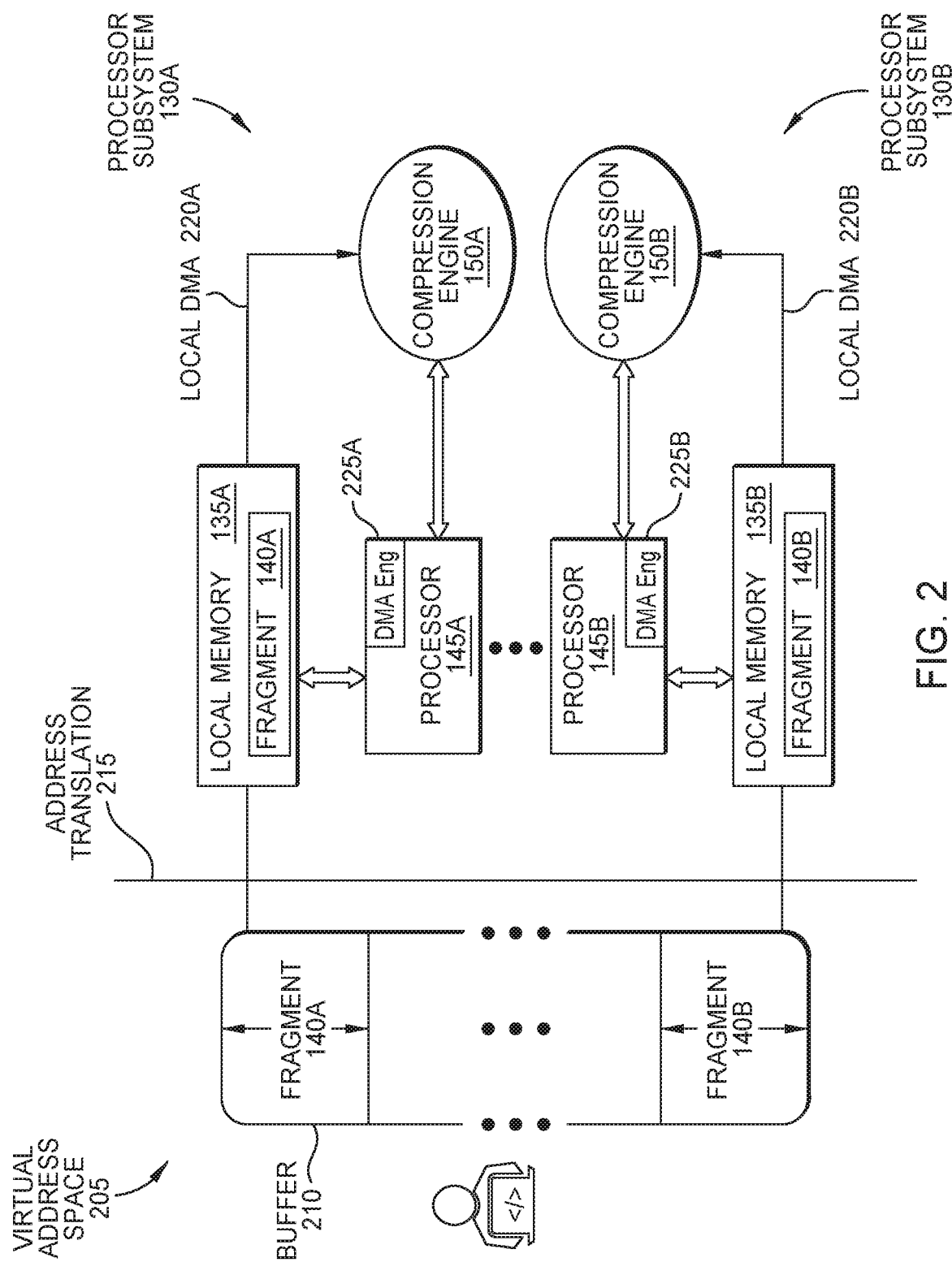
FIG. 2 illustrates storing fragments of a buffer in different processor subsystems, according to one embodiment described herein.

FIG. 2 illustrates storing fragments of a buffer in different processor subsystems, according to one embodiment described herein. The left side of FIG. 2 illustrates a virtual address space 205 that includes a buffer 210. For example, the buffer 210 can be the buffer assigned to the application 115 discussed in FIG. 1. That is, the OS 110 can assign a range of addresses to the application 115 which it can then use to generate the buffer 210. In one embodiment, the range of addresses forming the buffer 210 may be contiguous.

As shown, the buffer 210 is formed using multiple memory fragments 140. In one embodiment, these fragments 140 may be pages of physical memory, or any other unit used to divide physical memory. While the virtual addresses of the buffer 210 are generally contiguous, the physical addresses of the fragments 140 may be discontinuous. That is, the fragments 140 may be spread out in the physical memory elements in the computing system. Specifically, the right side of FIG. 2 illustrates that the fragments 140 are stored in local memories 135 in different processor subsystems 130.

To perform memory translation between the virtual address space 205 and the physical address of the local memories 135, the computing system includes an address translation interface 215. This interface 215 can convert a virtual address in the virtual addresses space 205 to a physical address that then maps to one of the local memories 135. The physical address in each of the fragments 140 may be contiguous, but physical addresses for two different local memories 135 may be discontinuous.

The processors 145 in the processor subsystems 130 include direct memory access (DMA) engines 225 for performing DMAs within the processor subsystem 130 and between two different processor subsystems 130. As shown, the DMA engine 225 can execute a local DMA 220 between the local memory 135 and the compression engine 150. That is, the DMA engine 225 can instruct the local memory 135 to send stored data (e.g., the fragments 140) directly to the compression engine 150. Although not shown in FIG. 2, the DMA engine 225 can also instruct a local memory 135 in a different processor subsystem 130 to perform a non-local DMA to transfer stored data to the compression engine 150. However, as mentioned above, the latency incurred by the local DMAs 220 may be much less than the latency for performing DMAs between memories 135 and compression engines 150 in different processor subsystems 130.

To leverage the lower latency when performing local DMAs 220, in one embodiment, the fragments 140 in the buffer 210 are compressed by their local compression engines 150. That way, the fragments 140 are transmitted from the local memories 135 to the compression engines 150 using only local DMAs 220. Avoiding transmitting data between the processor subsystems 130 avoids the longer latency associated with non-local DMAs.

Figure 3:
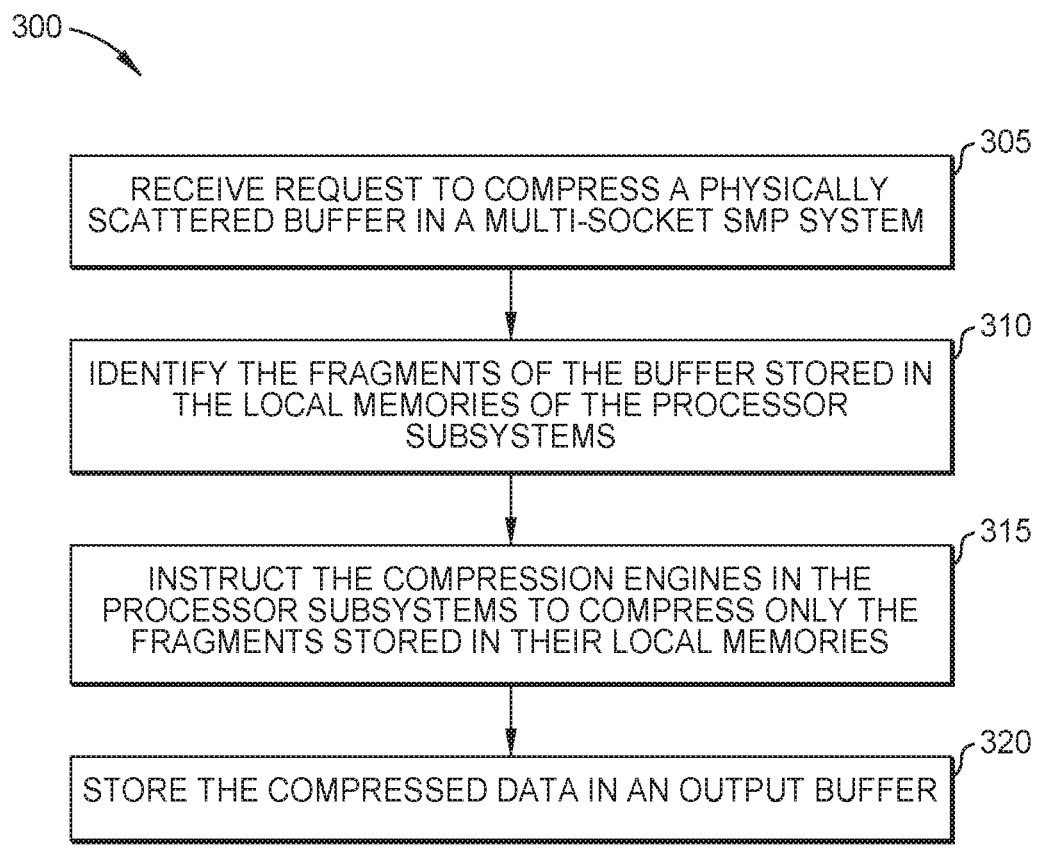
FIG. 3 is a flowchart for instructing compression engines in multiple processor subsystems to compress fragments stored in local memory, according to one embodiment described herein.

FIG. 3 is a flowchart of a method 300 for instructing compression engines in multiple processor subsystems to compress fragments stored in local memory, according to one embodiment described herein. At block 305, a compression library (e.g., a gzip library) receives a request to compress a physically scattered buffer in a computing system such as a multi-socket SMP computing system. The request may originate from a software application which was allocated a portion of user address space (e.g., virtual address space) for storing the buffer. As shown in FIG. 2, the buffer 210 includes multiple fragments 140 that are scattered across different physical memories (i.e., the local memories 135).

At block 310, the compression library identifies the fragments of the buffer stored in the local memories of the processor subsystems. That is, the compression library can perform (or request the OS to perform) a virtual to physical address translation on the buffer to identify the fragments and their associated physical addresses. The compression library can identify the local memories using the physical addresses. Multiple fragments of the buffer can be stored in the same local memories. For example, one local memory in a processor subsystem may store several fragments of the buffer while another local memory in a different processor subsystem may store only one fragment of the buffer. Additionally, the compression library may determine that several of the processor subsystems (and their corresponding local memories) do not store any fragments of the buffer.

At block 315, the compression library instructs the compression engines in the processor subsystems to compress only the fragments stored in their local memories. That is, once the locations of the fragments are identified, the compression library can issue individual requests or instructions to the compression engines located at those locations (e.g., the identified processor subsystems) to perform compression on the fragments stored at the same locations. Thus, the compression library may receive a single compression request (e.g., a single gzip operation) from the application at block 305, but then at block 315, issue multiple separate compression requests to the individual compression engines.

As mentioned above, using multiple compression instructions to ensure the compression engines compress only the fragments stored in the same processor subsystems means that the data transfers between the local memories storing the fragments and the compression engines are local DMAs rather than non-local DMAs. That is, each compression engine is used to retrieve and compress only the fragments stored in the same processor subsystem to avoid transferring fragments from local memory in one processor subsystem to a compression engine in a different processor subsystem.

However, in one embodiment, the compression library may select one or more of the compression engines to compress fragments stored in a different processor subsystem, e.g., using a non-local DMA. That is, one of the compression engines may be busy doing a job. Rather than stalling the compression process waiting for the compression engine to be available to compress its local fragment, the compression library may assign a compression engine in a different processor subsystem to compress the fragment. Thus, some of the compression engines may compress fragments that are in their own processor subsystems as well as fragments in other processor subsystems.

As discussed in more detail below, there are at least two embodiments for instructing the compression engines to compress only the fragments stored in their local memories at block 315. In one embodiment, the compression library instructs the compression engines to sequentially compress their fragments. That is, a first compression engine compress its fragment, and once complete, the compression library instructs a second compression engine to compress its fragment, and so forth. In another embodiment, the compression engines instructs all the compression engines to compress the fragments in parallel. That is, the compression engines can, in parallel, retrieve the fragment or fragments from the local memories in the same processor subsystem and compress the data. There are advantages and disadvantages to both of these embodiments which are described below.

At block 320, the compression engines store the compressed data (e.g., the compressed fragments) in an output buffer. In one embodiment, when transmitting the compression request to the compression library at block 305, the application can provide a pointer to an output buffer that the compression engines should use to store the compressed data. The manner in which the compression library ensures the compressed data is stored in the output buffer depends on whether the compression engines compress the data sequentially or in parallel. In either case, once the compression engines have compressed the data and the compression library ensures the compressed data is stored in the output buffer provided by the application, the compression library can inform the application that the compression request is complete.

Figure 4:
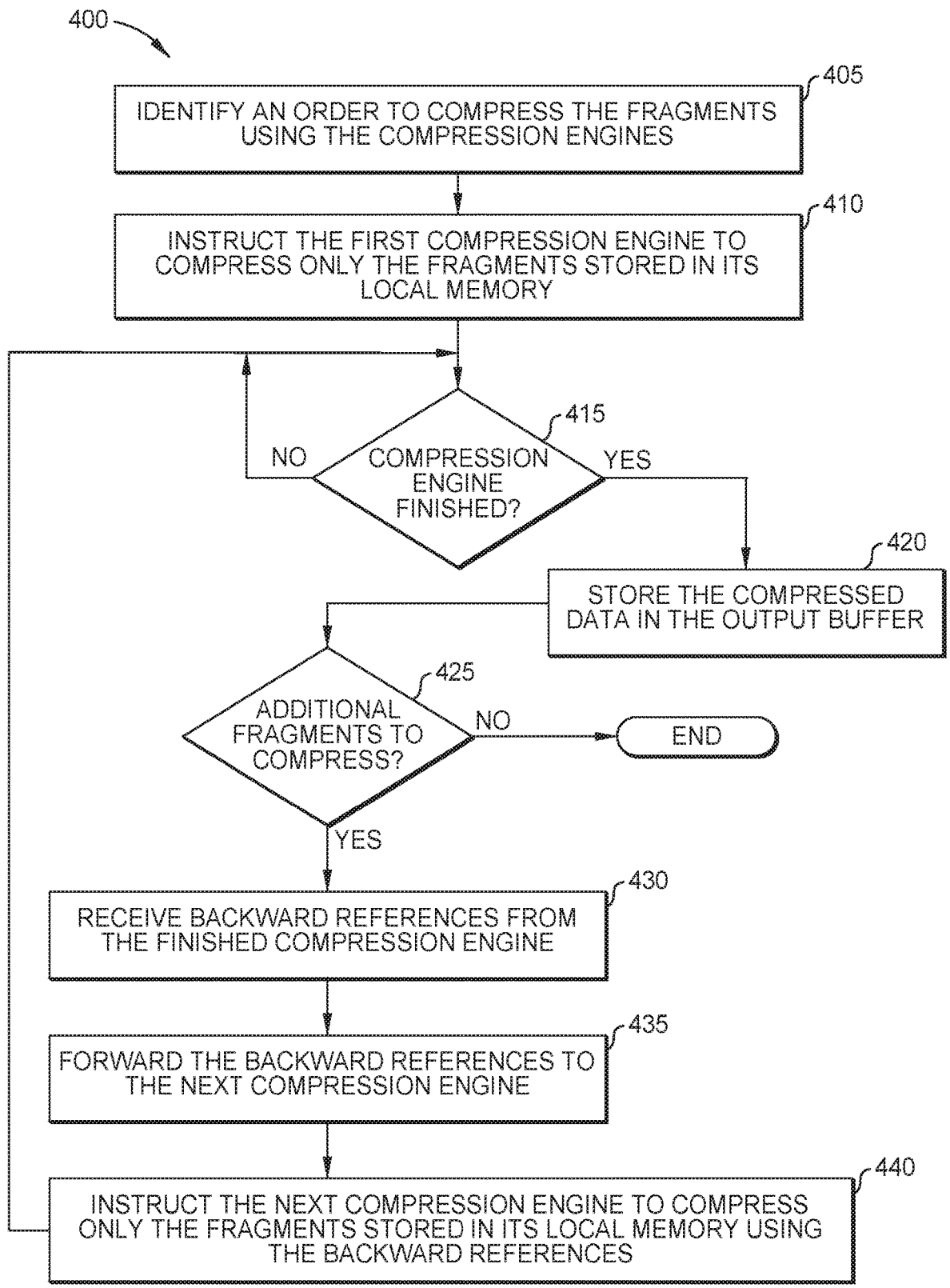
FIG. 4 is a flowchart for instructing compression engines to sequentially compress fragments stored in local memory, according to one embodiment described herein.

FIG. 4 is a flowchart of a method 400 for instructing compression engines to sequentially compress fragments stored in local memory, according to one embodiment described herein. In one embodiment, the method 400 illustrates various blocks for performing block 315 in the method 300. In the method 400, the compression library instructs the compression engines to compress their corresponding fragments one at a time, rather than compressing the fragments in parallel.

At block 405, the compression library identifies an order to compress the fragments using the compression engines. Using FIG. 2 as an example, the fragment 140A is shown at the beginning of the buffer 210 while the fragment 140B is at the end of the buffer 210. The compression library instructs the compression engine 150A to first compress the fragment 140A stored in the local memory 135A before instructing the compression engine 150B to compress the fragment 140B. In this manner, the compression library can identify an order that the compression engines 150 should execute such that the fragments 140 are compressed in the same order they are arranged in the buffer 210. Doing so can have several advantages: first, compressing the fragments in the order they are arranged in the buffer can make it easier to store the compressed data in the output buffer, and second, the compression engines can share history information to make compression more efficient, as described below.

At block 410, the compression library instructs the first compression engine to compress only the fragments stored in its local memory. Put differently, using the order identified at block 405, the compression library instructs the first compression engine to use a local DMA to retrieve and then compress the fragment (or fragments) stored in the same processor subsystem.

At block 415, the compression library determines whether the first compression engine has completed compressing the fragments stored in the same processor subsystem. If not, the compression library continues to wait. However, once the first compression engine finishes, it can send a notification to the compression library and the method 400 proceeds to block 420.

At block 420, the compression engine stores the compressed data in the output buffer. In one embodiment, after compressing the fragment, the compression engine can store the data directly into a physical memory assigned to store the output buffer using a DMA. Depending on the physical memory assigned to the output buffer, the DMA may be a local DMA (if the memory happens to be in the same processor subsystem) or a non-local DMA (if the memory is in a different processor subsystem). In any case, the compression engine can store the data directly into the output buffer without transmitting the data to a temporary buffer (which may be different when the compression engines execute in parallel rather than sequentially). That is, because the compression engines are executed sequentially according to the order determined at block 405, the compressed data can be stored directly into the output buffer.

At block 425, the compression library determines whether there are additional fragments to compress. If not, the method 400 ends. Otherwise, the method 400 proceeds to block 430 where the compression library receives the history information from the finished compression operation. That is, in addition to storing the compressed data in the output buffer, the compression engine also transmits its history information to the compression library. In one embodiment, the history information enables the compression engine to recognize patterns it has experienced before. That is, when compressing the fragment, the compression engine can identify reoccurring patterns using the history information and build a backward reference to them. When identifying a previously encountered pattern using the history information, the compression engine can provide a pointer to the previous pattern (also called a backward reference) which improves compression efficiency.

At block 435, the compression library forwards the history information to the next compression engine—i.e., the compression engine selected to execute the next operation according to the sequential order identified at block 405. Forwarding the history information used by the previous compression engine to the next compression engine can improve the compression ratio—e.g., reduce the size of the compressed data. As each compression engine finishes compressing its corresponding fragments, its history information is passed to the next compression engine so that each compression engine (except for the first compression engine) can benefit from the history information identified by the previous compression engines. This can improve the compression ratio relative to a system where the history information is not shared between the sequentially executing compression engines.

At block 440, the compression library instructs the next compression engine to compress only the fragments stored in its local memory using the history information. The method 400 then returns to block 415. In this manner, the compression library serves as a mastermind or central controller to provide instructions to sequentially invoke the compression engine to ensure each of the fragments forming the physically scattered buffer is executed using a compression engine in the same processor subsystem. By invoking the compression engines sequentially, the method 400 takes advantages of the history information which is shared between the compression engines.

Figure 5:
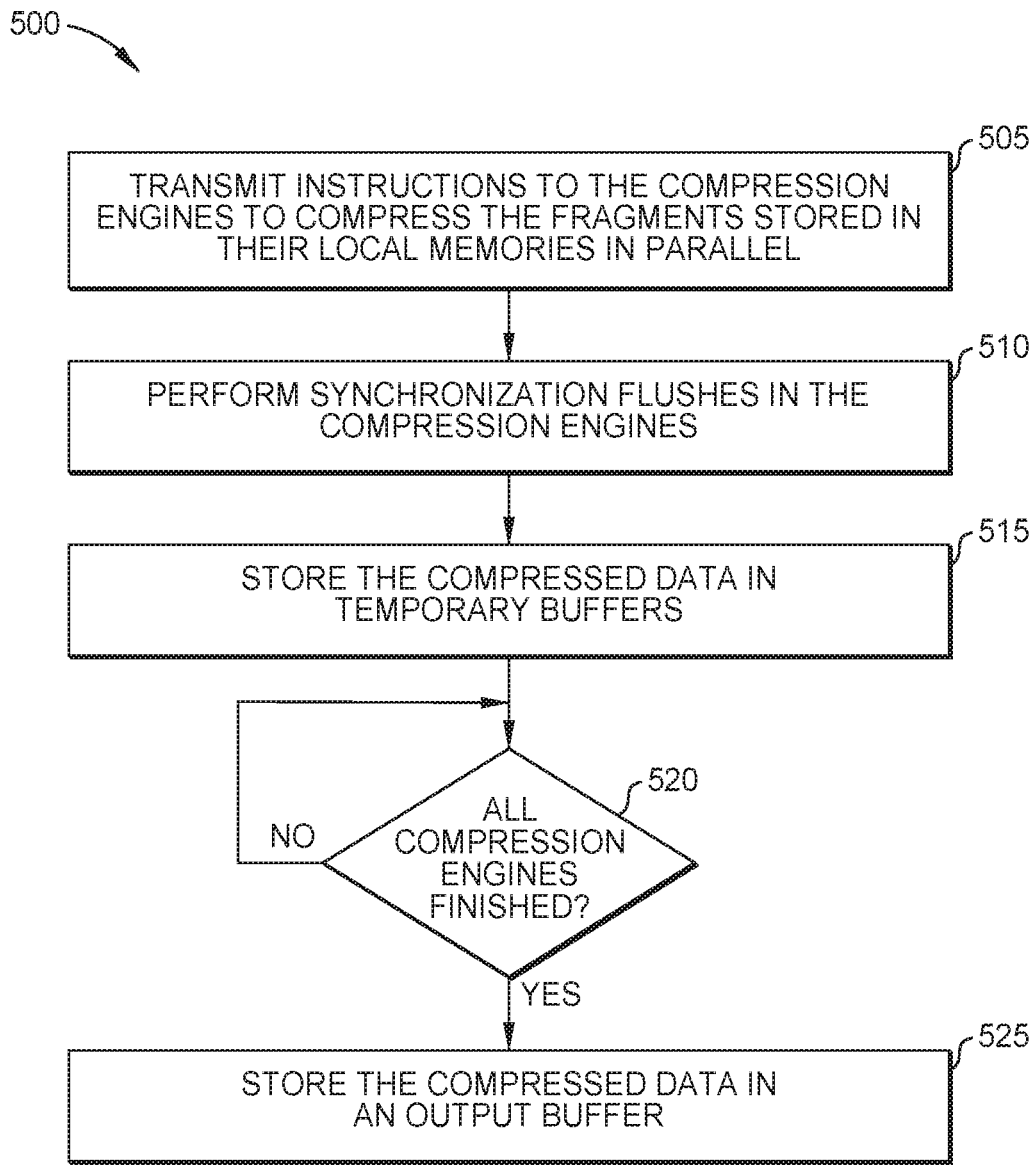
FIG. 5 is a flowchart for instructing compression engines to compress fragments stored in local memory in parallel, according to one embodiment described herein.

FIG. 5 is a flowchart of a method 500 for instructing compression engines to compress fragments stored in local memory in parallel, according to one embodiment described herein. Unlike in the method 400, the method 500 can be used to instruct the compression engines to execute in parallel rather than sequentially.

At block 505, the compression library transmits instructions to the compression engines to compress the fragments stored in their local memories in parallel. That is, the compression library has already identified the processor subsystems that store the fragments for the buffer, and thus, has identified the compression engines that should be used to compress the fragments.

In one embodiment, the compression library can send individual instructions to each of the identified compression engines to compress the fragments stored in the respective processor subsystem. As a result, the compression engines execute in parallel, rather than sequentially to compress the fragments of the buffer. Because the size of the fragments and the current workload on the compression engines can vary, some of the compression engines may finish compressing the data before others. As a result, the compressed data may be available at different times.

At block 510, the compression operation is performed using deflate's multi block feature wherein each physical memory fragment is compressed by respective compression engine in parallel. The compression engine uses certain flush mode as block marker for each independent block. Because the compression engines compress the data in parallel, the compression library may want to arrange the compressed data so that it appears to have been compressed in order (like in method 400, or if a single compression engine compress the fragments in order). The deflate's multi block flush mode (e.g. Z SYNC FLUSH) permits the compression engines to compress the data in parallel so that the blocks of compressed data are independent of each other. That is, the compression engines do not need to share their history information when compressing the data. Performing this operation may add several bytes of overhead in the chunks of compressed data produced by each of the compression engines. This overhead (or separation data) enables the compression library to the collect the chunks of compressed data and store them in an output buffer assigned to the application.

At block 515, the compression engines store the compressed data in temporary buffers. While method 400 permits the compression engines (which execute sequentially) to store the compressed data directly in the output buffer, in method 500 the compression engines store the compressed data in temporary buffers. For example, the size of the compressed data generated by each compression engine is unknown when compression begins, thus each compression engine cannot be assigned a portion of the output buffer since the compression library does not know how much compressed data will be generated. As such, the compression engines are each assigned a temporary buffer to store its compressed data.

At block 520, the compression library determines whether all the compression engines have finished compressing the fragments stored locally. If so, the method 500 proceeds to block 525 where the compression library stores the compressed data in an output buffer assigned to the application making the initial request at block 405 of method 400. That is, the compression library gathers the compressed data from the temporary buffers and stores the data in the physical memory corresponding to the output buffer. In one embodiment, the compression library stores the different chunks of compressed data in the output buffer as if the compressed data was generated by the compression engines sequentially (or was generated by a single compression engine). However, unlike when compressing the fragments sequentially, the chunks of compressed data contains the overhead introduced by the deflates's flush mode since the history information was not shared between the compression engines. Thus, while the method 500 has the advantage of compressing the fragments in parallel using the compression engines, the compression engines cannot share the history information which means compression may be less efficient due to adding the overhead bytes from performing deflate's flush mode. Thus, the decision whether to use method 400 or 500 is a tradeoff at least partly between compression speed and compression efficiency.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., the application 115 in FIG. 1) or related data available in the cloud. For example, the application 115 could execute on a SMP computing system in the cloud and to perform a user function. In such a case, the request to compress the buffer corresponding to the application 115 could execute on processor subsystems in the cloud and store the resulting compressed data at a storage location in the cloud. Doing so allows a user to access this information from any computing system attached to a network connected to the cloud (e.g., the Internet).

While the foregoing is directed to embodiments of the present invention, other and further embodiments of the invention may be devised without departing from the basic scope thereof, and the scope thereof is determined by the claims that follow.

What is claimed is:

1. A method comprising:
receiving a request to compress a buffer comprising a plurality of fragments;
identifying a plurality of processor subsystems in a computing system that each stores at least one of the plurality of fragments in a local memory, wherein the plurality of fragments are assigned contiguous virtual memory addresses associated with the buffer, wherein each of the plurality of processor subsystems comprises a compression engine and share a virtual address space with each other;
instructing each compression engine in the plurality of processor subsystems to compress only fragments of the plurality of fragments stored in the same processor subsystem as the respective compression engine; and
storing the compressed fragments in an output buffer.

2. The method of claim 1, wherein the plurality of processor subsystems form a multi-socket symmetric multiprocessing (SMP) computing system, wherein each compression engine is one of (i) part of a processor in each of the plurality of processor subsystems and (ii) a hardware accelerator separate from the processor.

3. The method of claim 1, wherein identifying the plurality of processor subsystems in the computing system comprises:
identifying a subset of a total number of processor subsystems in the computing system that store at least one of the plurality of fragments, wherein at least one of the total number of processor subsystems does not store at least one of the plurality of fragments.

4. The method of claim 1, wherein instructing each compression engine in the plurality of processor subsystems to compress only fragments of the plurality of fragments stored in the same processor subsystem as the compression engine, comprises:
identifying an order to compress the plurality of fragments using the compression engines; and
instructing the compression engines to sequentially compress the plurality of fragments using the identified order.

5. The method of claim 4, wherein instructing each compression engine in the plurality of processor subsystems to compress only fragments of the plurality of fragments stored in the same processor subsystem as the compression engine, comprises:
receiving history information from a previous compression engine that has finished compressing the fragments stored in the same processor subsystem; and
forwarding the history information to a next compression engine as indicated by the identified order, wherein the next compression engine uses the history information when compressing the fragments stored in the same processor subsystem.

6. The method of claim 4, wherein when storing the compressed fragments in the output buffer, each compression engine uses a direct memory transfer to store the compressed fragments directly into the output buffer.

7. The method of claim 4, wherein instructing each compression engine in the plurality of processor subsystems to compress only fragments of the plurality of fragments stored in the same processor subsystem as the compression engine, comprises:
   performing a deflate flush operation on the compressed fragment generated by each of the compression engine; and
   storing the compressed fragments in temporary buffers before storing the compressed fragments in the output buffer.

8. The method of claim 1, wherein instructing each compression engine in the plurality of processor subsystems to compress only fragments of the plurality of fragments stored in the same processor subsystem as the compression engine, comprises:
   instructing each compression engine to compress the fragments in parallel.

9. A computer readable storage medium having computer readable program code embodied therewith, the computer readable program code executable by one or more computer processors to perform an operation, the operation comprising:
   receiving a request to compress a buffer comprising a plurality of fragments;
   identifying a plurality of processor subsystems in a computing system that each stores at least one of the plurality of fragments in a local memory, wherein the plurality of fragments are assigned contiguous virtual memory addresses associated with the buffer, wherein each of the plurality of processor subsystems comprises a compression engine and share a virtual address space with each other;
   instructing each compression engine in the plurality of processor subsystems to compress only fragments of the plurality of fragments stored in the same processor subsystem as the compression engine; and
   storing the compressed fragments in an output buffer.

10. The computer readable storage medium of claim 9, wherein identifying the plurality of processor subsystems in the computing system comprises:
    identifying a subset of a total number of processor subsystems in the computing system that store at least one of the plurality of fragments, wherein at least one of the total number of processor subsystems does not store at least one of the plurality of fragments.

11. The computer readable storage medium of claim 9, wherein instructing each compression engine in the plurality of processor subsystems to compress only fragments of the plurality of fragments stored in the same processor subsystem as the compression engine, comprises:
    identifying an order to compress the plurality of fragments using the compression engines; and
    instructing the compression engines to sequentially compress the plurality of fragments using the identified order.

12. The computer readable storage medium of claim 11, wherein instructing each compression engine in the plurality of processor subsystems to compress only fragments of the plurality of fragments stored in the same processor subsystem as the compression engine, comprises:
    receiving history information from a previous compression engine that has finished compressing the fragments stored in the same processor subsystem; and
    forwarding the history information to a next compression engine as indicated by the identified order, wherein the next compression engine uses the history information when compressing the fragments stored in the same processor subsystem.

13. The computer readable storage medium of claim 9, wherein instructing each compression engine in the plurality of processor subsystems to compress only fragments of the plurality of fragments stored in the same processor subsystem as the compression engine, comprises:
    instructing each compression engine to compress the fragments in parallel;
    performing a deflate operation with a flush mode on the compressed fragment generated by each of the compression engine; and
    storing the compressed fragments in temporary buffers before storing the compressed fragments in the output buffer.

14. A system, comprising:
    a plurality of processor subsystems, each of the plurality of processor subsystems comprising a local memory and a compression engine, and the plurality of processor subsystems sharing a virtual address space; and
    a compression library configured to:
      receive a request to compress a buffer comprising a plurality of fragments,
      identify a subset of the plurality of processor subsystems each stores at least one of the plurality of fragments, wherein the plurality of fragments are assigned contiguous virtual memory addresses associated with the buffer, and
      instruct each compression engine in the plurality of processor subsystems to compress only fragments of the plurality of fragments stored in the same processor subsystem as the compression engine and store the compressed fragments in an output buffer.

15. The system of claim 14, wherein the plurality of processor subsystems form a multi-socket SMP computing system, wherein each compression engine is one of (i) part of a processor in each of the plurality of processor subsystems and (ii) a hardware accelerator separate from the processor.

16. The system of claim 14, wherein instructing each compression engine in the plurality of processor subsystems to compress only fragments of the plurality of fragments stored in the same processor subsystem as the compression engine, comprises:
    identifying an order to compress the plurality of fragments using the compression engines; and
    instructing the compression engines to sequentially compress the plurality of fragments using the identified order.

17. The system of claim 16, wherein instructing each compression engine in the plurality of processor subsystems to compress only fragments of the plurality of fragments stored in the same processor subsystem as the compression engine, comprises:
    receiving history information from a previous compression engine that has finished compressing the fragments stored in the same processor subsystem; and
    forwarding the history information to a next compression engine as indicated by the identified order, wherein the next compression engine uses the history information when compressing the fragments stored in the same processor subsystem.

18. The system of claim 16, wherein when storing the compressed fragments in the output buffer, each compression engine uses a direct memory transfer to store the compressed fragments directly into the output buffer.

19. The system of claim 14, wherein instructing each compression engine in the plurality of processor subsystems to compress only fragments of the plurality of fragments stored in the same processor subsystem as the compression engine, comprises:
   instructing each compression engine to compress the fragments in parallel.

20. The system of claim 19, wherein instructing each compression engine in the plurality of processor subsystems to compress only fragments of the plurality of fragments stored in the same processor subsystem as the compression engine, comprises:
   performing a deflate flush operation on the compressed fragment generated by each of the compression engine; and
   storing the compressed fragments in temporary buffers before storing the compressed fragments in the output buffer.

* * * * *